(12) United States Patent
Taskar et al.

(10) Patent No.: US 10,128,087 B2
(45) Date of Patent: Nov. 13, 2018

(54) CONFIGURATION INDEPENDENT GAS DELIVERY SYSTEM

(71) Applicant: Lam Research Corporation, Fremont, CA (US)

(72) Inventors: Mark Taskar, San Mateo, CA (US); Iqbal Shareef, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 482 days.

(21) Appl. No.: 14/680,244

(22) Filed: Apr. 7, 2015

(65) Prior Publication Data

US 2015/0287573 A1  Oct. 8, 2015

Related U.S. Application Data

(60) Provisional application No. 61/976,255, filed on Apr. 7, 2014.

(51) Int. Cl.
*H01J 37/00* (2006.01)
*H01J 37/32* (2006.01)
(Continued)

(52) U.S. Cl.
CPC ............ *H01J 37/3244* (2013.01); *B01F 3/02* (2013.01); *B01F 5/048* (2013.01); *Y10T 29/49826* (2015.01)

(58) Field of Classification Search
CPC ......... B01F 3/02; B01F 5/048; H01J 37/3244; Y10T 29/49826
See application file for complete search history.

(56) References Cited

U.S. PATENT DOCUMENTS 2,361,150 A   10/1944  Petroe
2,569,857 A   10/1951  Jaegle et al.
(Continued)

FOREIGN PATENT DOCUMENTS

JP   2003-334479 A    11/2003
JP   2004-214591 A     7/2004
(Continued)

OTHER PUBLICATIONS

U.S. Notice of Allowance dated Mar. 22, 2018 issued in U.S. Appl. No. 14/809,041.
(Continued)

*Primary Examiner* — Anshu Bhatia
(74) *Attorney, Agent, or Firm* — Weaver Austin Villeneuve & Sampson LLP

(57) ABSTRACT

A gas delivery apparatus for supplying process gas to a processing chamber of a plasma processing apparatus includes a mixing manifold having a plurality of gas inlets on a surface thereof, the gas inlets being equally spaced from a center mixing point of the mixing manifold; and optionally a plurality of gas supplies in communication with the plurality of gas inlets on the surface of the mixing manifold. A method of supplying gas to a processing chamber of a plasma processing apparatus using such a gas delivery apparatus involves providing a plurality of gas supplies in communication with a plurality of gas inlets on a surface of a mixing manifold; flowing at least two different gases from the plurality of gas supplies to the mixing manifold to create a first mixed gas; and supplying the first mixed gas to a plasma processing chamber coupled downstream of the mixing manifold.

19 Claims, 9 Drawing Sheets

Figure 1:
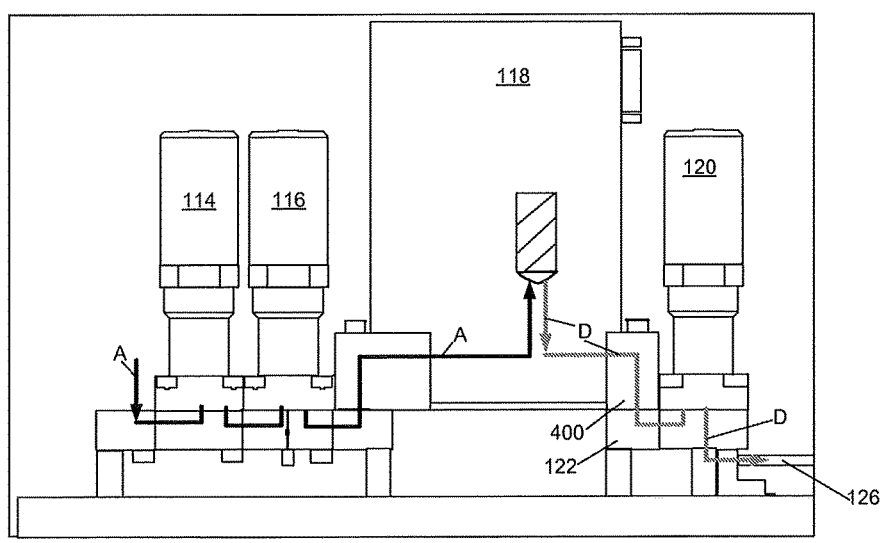

(51) Int. Cl.
*B01F 3/02* (2006.01)
*B01F 5/04* (2006.01)

(56) References Cited

U.S. PATENT DOCUMENTS

| | | | |
|---|---|---|---|
| 3,026,183 A | 3/1962 | Cole, III | |
| 3,102,004 A | 8/1963 | Grintz | |
| 3,865,133 A | 2/1975 | Alford | |
| 4,099,919 A | 7/1978 | Leidal | |
| 4,134,002 A | 1/1979 | Stanford | |
| 4,215,081 A | 7/1980 | Brooks | |
| 4,264,212 A | 4/1981 | Tookey | |
| 4,422,471 A * | 12/1983 | Faccini | F23D 14/465 137/561 A |
| 4,545,328 A | 10/1985 | Fujiyama et al. | |
| 4,581,521 A | 4/1986 | Grise | |
| 4,703,718 A | 11/1987 | Enstrom | |
| 4,714,091 A | 12/1987 | Wagner | |
| 5,063,027 A | 11/1991 | Schneider | |
| 5,082,633 A | 1/1992 | Stuper | |
| 5,534,328 A | 7/1996 | Ashmead et al. | |
| 5,794,645 A | 8/1998 | Rohrberg et al. | |
| 5,836,355 A | 11/1998 | Markulec et al. | |
| 5,887,977 A | 3/1999 | Morikawa | |
| 5,911,342 A | 6/1999 | Sindoni | |
| 5,950,874 A | 9/1999 | Sindoni | |
| 5,984,519 A | 11/1999 | Onodera et al. | |
| 6,068,016 A | 5/2000 | Manofsky, Jr. et al. | |
| 6,073,646 A | 6/2000 | Kimura | |
| 6,125,887 A | 10/2000 | Pinto | |
| 6,159,442 A | 12/2000 | Thumm et al. | |
| 6,168,948 B1 | 1/2001 | Anderson et al. | |
| 6,186,177 B1 | 2/2001 | Maher | |
| 6,260,581 B1 | 7/2001 | Hollingshead | |
| 6,269,978 B1 | 8/2001 | Sindoni | |
| 6,283,143 B1 | 9/2001 | Adachi, Jr. et al. | |
| 6,283,155 B1 | 9/2001 | Vu | |
| 6,302,141 B1 | 10/2001 | Markulec et al. | |
| 6,352,594 B2 | 3/2002 | Cook et al. | |
| 6,440,504 B1 | 8/2002 | Akiyama | |
| 6,546,960 B1 | 4/2003 | Rohrberg et al. | |
| 6,581,640 B1 | 6/2003 | Barron | |
| 6,640,835 B1 | 11/2003 | Rohrberg et al. | |
| 6,648,020 B2 | 11/2003 | Fujimoto et al. | |
| 6,655,829 B1 | 12/2003 | Vanden Bussche et al. | |
| 6,718,817 B1 | 4/2004 | Ko et al. | |
| 6,753,200 B2 | 6/2004 | Craighead et al. | |
| 6,880,745 B2 | 4/2005 | Stueber et al. | |
| 6,907,904 B2 | 6/2005 | Harris et al. | |
| 7,055,550 B2 | 6/2006 | Harris et al. | |
| 7,126,094 B2 | 10/2006 | Bower et al. | |
| 7,140,558 B2 | 11/2006 | McCracken et al. | |
| 7,150,475 B2 | 12/2006 | Eriksson et al. | |
| 7,178,556 B2 | 2/2007 | Reid, II et al. | |
| 7,195,037 B2 | 3/2007 | Eidsmore | |
| 7,225,835 B2 | 6/2007 | Vu | |
| 7,234,222 B1 | 6/2007 | Hao et al. | |
| 7,261,812 B1 | 8/2007 | Karp et al. | |
| 7,299,825 B2 | 11/2007 | Milburn | |
| 7,307,247 B2 | 12/2007 | Bower et al. | |
| 7,320,339 B2 | 1/2008 | Milburn | |
| 7,334,605 B2 | 2/2008 | Vu | |
| 7,404,417 B2 | 7/2008 | Eidsmore | |
| 7,410,519 B1 | 8/2008 | Ewald | |
| 7,789,107 B2 | 9/2010 | Eriksson et al. | |
| 7,798,388 B2 | 9/2010 | Crockett et al. | |
| 7,806,143 B2 | 10/2010 | Taskar | |
| 7,892,357 B2 | 2/2011 | Srivastava | |
| 7,976,795 B2 | 7/2011 | Zhou et al. | |
| 8,122,910 B2 | 2/2012 | Taskar | |
| 8,196,480 B1 | 6/2012 | Mayeaux | |
| 8,196,609 B2 | 6/2012 | Oya et al. | |
| 8,322,380 B2 | 12/2012 | Taskar | |
| 8,340,827 B2 | 12/2012 | Yun et al. | |
| 8,521,461 B2 | 8/2013 | Shareef et al. | |
| 8,746,284 B2 | 6/2014 | DeDontney | |
| 8,794,267 B2 | 8/2014 | Shareef et al. | |
| 8,846,183 B2 | 9/2014 | Unger et al. | |
| 8,851,113 B2 | 10/2014 | Taskar et al. | |
| 8,852,685 B2 | 10/2014 | Kenworthy et al. | |
| 9,879,795 B2 | 1/2018 | Burkhart et al. | |
| 10,022,689 B2 | 7/2018 | Shareef et al. | |
| 2002/0017329 A1 | 2/2002 | Fukushima | |
| 2002/0072164 A1 | 6/2002 | Umotyo et al. | |
| 2002/0176317 A1 | 11/2002 | Bellasalma et al. | |
| 2003/0124842 A1 | 7/2003 | Hytros et al. | |
| 2004/0091406 A1 | 5/2004 | Wolfert et al. | |
| 2004/0092118 A1 | 5/2004 | Johnson et al. | |
| 2004/0125689 A1 | 7/2004 | Ehrfeld et al. | |
| 2004/0189311 A1 | 9/2004 | Glezer et al. | |
| 2004/0231586 A1 | 11/2004 | Dugue et al. | |
| 2005/0005981 A1 | 1/2005 | Eidsmore et al. | |
| 2005/0104242 A1 | 5/2005 | Olaru | |
| 2005/0284529 A1 | 12/2005 | Iwabuchi | |
| 2006/0028908 A1 | 2/2006 | Suriadi et al. | |
| 2007/0007204 A1 | 1/2007 | Schanz et al. | |
| 2007/0138203 A1 | 6/2007 | Sacchet | |
| 2007/0140042 A1 | 6/2007 | Schanz et al. | |
| 2007/0253281 A1 | 11/2007 | Radford et al. | |
| 2007/0291581 A1 | 12/2007 | Ehrfeld et al. | |
| 2008/0066859 A1 | 3/2008 | Kobayashi et al. | |
| 2008/0106968 A1 | 5/2008 | Schanz et al. | |
| 2009/0071556 A1 | 3/2009 | Bourlart et al. | |
| 2009/0120364 A1 | 5/2009 | Suarez et al. | |
| 2010/0067323 A1 | 3/2010 | Blom et al. | |
| 2011/0005601 A1 * | 1/2011 | Shareef | H01L 21/67069 137/1 |
| 2011/0158931 A1 | 6/2011 | Wittek | |
| 2012/0175442 A1 | 7/2012 | Xiong et al. | |
| 2012/0237696 A1 | 9/2012 | Huseinovic et al. | |
| 2012/0263012 A1 | 10/2012 | Xiong et al. | |
| 2013/0025718 A1 | 1/2013 | Nagase et al. | |
| 2013/0248511 A1 | 9/2013 | Wallinger | |
| 2013/0255782 A1 | 10/2013 | Shareef et al. | |
| 2013/0255883 A1 | 10/2013 | Shareef et al. | |
| 2014/0020779 A1 | 1/2014 | Vu | |
| 2014/0076236 A1 | 3/2014 | Sankarakrishnan et al. | |
| 2014/0090599 A1 | 4/2014 | Saitou | |
| 2014/0137961 A1 | 5/2014 | Kao et al. | |
| 2014/0182689 A1 | 7/2014 | Shareef et al. | |
| 2014/0202577 A1 | 7/2014 | Webster, III | |
| 2014/0241960 A1 | 8/2014 | Mochizuki | |
| 2015/0362080 A1 | 12/2015 | Vu | |
| 2016/0111257 A1 | 4/2016 | Kellogg et al. | |
| 2017/0021317 A1 | 1/2017 | Shareef et al. | |
| 2017/0173886 A1 | 6/2017 | Menchik et al. | |
| 2017/0203511 A1 | 7/2017 | Burkhart et al. | |
| 2017/0204989 A1 | 7/2017 | Burkhart et al. | |

FOREIGN PATENT DOCUMENTS

| | | |
|---|---|---|
| KR | 10-2009-0125681 | 12/2009 |
| WO | WO 2014/199158 A1 | 12/2014 |
| WO | WO 2016/061493 A1 | 4/2016 |

OTHER PUBLICATIONS

U.S. Office Action, dated Jun. 22, 2017, issued in U.S. Appl. No. 14/517,192.

U.S. Final Office Action, dated Nov. 16, 2017, issued in U.S. Appl. No. 14/517,192.

U.S. Office Action, dated Dec. 30, 2016, issued in U.S. Appl. No. 14/997,419.

U.S. Final Office Action, dated Jul. 10, 2017, issued in U.S. Appl. No. 14/997,419.

U.S. Notice of Allowance, dated Sep. 27, 2017, issued in U.S. Appl. No. 14/997,419.

U.S. Notice of Allowance (Corrected), dated Jan. 3, 2018, issued in U.S. Appl. No. 14/997,419.

U.S. Office Action, dated Dec. 15, 2017, issued in U.S. Appl. No. 15/087,889.

(56) References Cited

OTHER PUBLICATIONS

U.S. Office Action dated Jun. 5, 2017, issued in U.S. Appl. No. 14/809,041.
U.S. Notice of Allowance dated Nov. 30, 2017, issued in U.S. Appl. No. 14/809,041.
PCT International Search Report and Written Opinion dated Dec. 28, 2015 issued in PCT/US2015/0555997.
PCT International Preliminary Report on Patentability and Written Opinion dated Apr. 27, 2017 issued in PCT/US2015/0555997.

* cited by examiner

Travel time for C4F6 from line-7 to line-4 =L1/(Velocity of C4 F6 Specie)
Travel time for N2 from line-4 to exit line =L2/Velocity of (C4F6 + N2specie)

CONFIGURATION INDEPENDENT GAS DELIVERY SYSTEM

CROSS REFERENCE TO RELATED APPLICATION

This application claims priority under 35 U.S.C. § 119(e) to U.S. Provisional Application No. 61/976,255, filed Apr. 7, 2014, the entire content of which is incorporated herein by reference thereto.

FIELD

The present invention relates to gas delivery systems. More particularly, the present invention relates to a configuration independent gas panel apparatus for gas delivery systems.

BACKGROUND INFORMATION

Conventional semiconductor etch processing systems typically utilize gas sticks. The term "gas sticks" refers, for example, to a series of gas distribution and control components such as a mass flow controller (MFC), one or more pressure transducers and/or regulators, a heater, one or more filters or purifiers, and shutoff valves. The components used in a given gas stick and their particular arrangement can vary depending upon their design and application. In a typical semiconductor processing arrangement, over seventeen gases may be connected to the chamber via gas supply lines, gas distribution components and substrates, and mixing manifolds. These are attached to a base plate forming a complete system known as "gas panel" or "gas box".

The conventional semiconductor etch processing system depends on the use of several hazardous and non-hazardous processing gases and carefully measured delivery of such gases from the gas source to the processing plasma chamber via the gas supply lines in a synchronized mode. Wafer etching applications are highly sensitive to the delivery time of the required mixture to the chamber. It is necessary to achieve good mixing of very low flow and high flow rate carrier gases and deliver them to the process chamber without significant delays to perform the various applications, such as etching.

SUMMARY

In embodiments, the present disclosure provides a gas delivery apparatus for supplying process gas to a processing chamber of a plasma processing apparatus. In embodiments, the gas delivery apparatus includes a mixing manifold having a plurality of gas inlets on a surface thereof, where the gas inlets are equally spaced from a center mixing chamber of the mixing manifold. In embodiments, a plurality of gas supplies is in communication with the plurality of gas inlets on the surface of the mixing manifold. In embodiments, the gas delivery apparatus further includes at least one mixing manifold outlet.

In further embodiments, the present disclosure provides a method of supplying process gas to a processing chamber of a plasma processing apparatus. In embodiments, the method comprises providing a plurality of gas supplies in communication with a plurality of gas inlets on a surface of a mixing manifold having at least one mixing manifold outlet; flowing at least two different gases from the plurality of gas supplies to the mixing manifold to create a first mixed gas; and supplying the first mixed gas to an interior of a plasma processing chamber wherein the mixed gas is energized into a plasma state for processing a semiconductor substrate. In embodiments, the gas inlets are equally spaced from a center mixing point of the mixing manifold, such that a path length for each of the at least two different gases is the same.

In further embodiments, the present disclosure provides a method of configuring a gas delivery apparatus for supplying process gas to a processing chamber of a plasma processing apparatus. In embodiments, the method involves providing a mixing manifold having a plurality of gas inlets on a surface thereof and at least one mixing manifold outlet, the gas inlets being equally spaced from a center mixing point of the mixing manifold; providing a plurality of gas supplies; and arranging the plurality of gas supplies such that they are in communication with the plurality of gas inlets.

BRIEF DESCRIPTION OF THE DRAWINGS

FIG. 1 illustrates the flow of gases through a gas stick.

FIG. 2 is a block diagram of FIG. 1 to illustrate the delay time of a low flow gas.

FIG. 3 illustrates a typical gas stick having a tubular/linear arrangement of MFCs.

FIG. 4 illustrates exemplary embodiments of gas supplies connected to a radial (side face) surface of a cylindrical mixing manifold.

FIG. 5 illustrates an exemplary embodiment of an array assembly using a master MFC.

FIG. 6 illustrates an embodiment of a mixing manifold having two rings.

FIG. 7A illustrates an exemplary embodiment of a first mixing hub.

FIG. 7B illustrates an exemplary embodiment of a second mixing hub.

FIG. 8A illustrates a top view of gas supplies connected to a mixing manifold including two mixing hubs.

FIG. 8B illustrates a bottom view of gas supplies connected to a mixing manifold including two mixing hubs.

FIG. 8C illustrates an elevated view of gas supplies connected to a mixing manifold including two mixing hubs.

DETAILED DESCRIPTION

Methods and apparatuses for delivering gas to a plasma processing chamber of a plasma processing apparatus are provided herein. In the following description, numerous specific details are set forth in order to provide a thorough understanding of embodiments described herein. It will be apparent, however, to one skilled in the art that embodiments herein may be practiced without some or all of these specific details. In other instances, well known process steps and/or structures have not been described in detail in order to not unnecessarily obscure the methods and apparatuses described herein.

Unless otherwise indicated, all numbers expressing quantities, conditions, and the like in the instant disclosure and claims are to be understood as modified in all instances by the term "about." The term "about" refers, for example, to numerical values covering a range of plus or minus 10% of the numerical value. The modifier "about" used in combination with a quantity is inclusive of the stated value.

In this specification and the claims that follow, singular forms such as "a", "an", and "the" include plural forms unless the content clearly dictates otherwise.

In embodiments, the present disclosure provides a gas delivery apparatus for supplying process gas to a processing chamber of a plasma processing apparatus. The term "gas" is not intended to be limiting and is meant to include any liquid, gas, or combination of liquid and gas. In embodiments, the gas delivery apparatus includes a mixing manifold having a plurality of gas inlets on a surface thereof and at least one mixing manifold outlet, and a plurality of gas supplies are optionally in communication with the plurality of gas inlets on the surface of the mixing manifold. In embodiments, the gas inlets are equally spaced from a central mixing chamber of the mixing manifold.

In previous typical gas panel apparatuses, fluid delivery panels used individual gas sticks with dedicated flow components (including valves, regulators, and so forth) arranged in a linear tubular design—that is to say, a multitude of gases or MFCs were placed along a length of tubing (or mixing manifold). Process gases are mixed downstream of the MFCs to a mixing manifold prior to delivery to the process chamber, such as a plasma reaction chamber. For example, in previous gas panel apparatuses, the mixing manifold was arranged as a long tubular structure and each gas line/MFC was spaced at a certain distance along the length of the tubular structure (so that the length of the manifold depended on the number of gases, and the length of the manifold increases as the number of gases increases). However, in such an arrangement, certain species were inherently located further away from the mixed gas exit (i.e., the gas species were disposed along the length of the mixing manifold, and would flow along the length of the manifold to reach the mixed gas exit, and thus some gas species must necessarily be located closer to the mixed gas exit than others). The arrangement of these manifolds thus results in differences in the amount of time it takes gas to mix and arrive at the reactor chamber, depending in the differences in the relative positions of the gas inlets.

Transient gas flow delays to the process chamber affect etch rates adversely for short process recipes due to non-stabilized or unsteady flows to the chamber. The problem is further exacerbated due to hardware differences in various gas boxes, causing different transport delays to process chambers to create etch matching issues. Gas line position is not consistent from tool to tool, which affects gas delivery performance and creates co-flow and process matching issues. That is to say, when two gas boxes are configured with their gases in different orders, the gas delivery performance will not match, resulting in reduced device yield and degraded binning. Furthermore, a gas box with multiple gas feeds of high and low flow rate gases, spatially separated in a random gas order from various MFCs, may be delivered at different times to the chamber depending on their diffusivity and flow velocities (momentum or inertia).

Gas delay delivery problems may be attributed to the volume through which low flow gases flow to mix with the higher flow carrier gas(es). Delayed delivery of key process etching gases to the reaction chamber impacts wafer etch rates and critical dimensions on semiconductor wafers. In a mixing manifold with an isolated low flow gas, located away from a high flow gas, the low flow gas will take a physical length of time to mix with higher flow gas, which is used to speed up delivery of the gas mixture to the chamber. The time required to fill the low flow gas volume from the MFC until it mixes with the high flow gas, as well as its diffusion through the high flow gas, determines the total transport delay to the reaction chamber.

Furthermore, gas panels are typically manufactured with three or more gas sticks since manufacturing fewer gas sticks is expensive and uses additional parts that may not be necessary to use. Thus, a user has no option other than having a set number of gas sticks. For semiconductor applications, the number of gas sticks is commonly 3, 6, 9, 12, and 16. However, if a user has a nine gas stick gas panel installed and wants to add one or two additional gas sticks, the user would be required to buy a gas pallet having a minimum of at least three gas sticks. It is difficult to efficiently connect a single gas stick to an existing gas panel without removing the entire gas stick, risking contamination, and/or using additional manual effort and time to remove and reinstall the gas delivery components.

Alternatively, should the user have a nine gas stick gas panel installed and later only needs to use seven gas sticks, two gas sticks would not be used on the gas panel. This would result in excess parts of the gas panel that are not used, and removal of the excess gas sticks from the gas panel would not be possible. This situation creates "dead-leg", a section of conduit or manifold through which gas does not flow. Dead-leg is considered to be a source of contamination.

FIG. 1 illustrates the flow of gases through a gas stick 100. The gas may flow out of the primary valve 114 and into MFC 118 in the direction of flow path A. The gas may then flow out of the MFC 118 into the substrate 122, through the mixing valve 120 and into the mixing manifold 126, as illustrated by flow path D.

Figure 2:
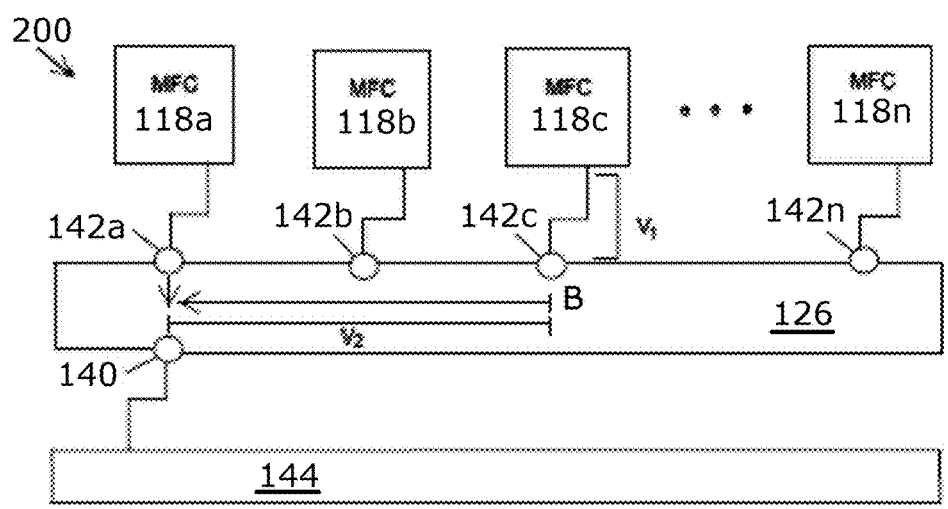

FIG. 2 is a block diagram of FIG. 1 to illustrate the delay time of a low flow gas. The gas box 200 may have a plurality of MFCs 118a, 118b, 118c, 118n (where n is an integer). Each MFC may be a high flow MFC or a low flow MFC. A low flow gas may have a flow rate, for example, of less than or equal to 7 sccm. A high flow gas may have a flow rate, for example, greater than 7 sccm. As illustrated in FIG. 2, MFC 118c is a low flow MFC and MFC 118a is a high flow MFC. However, this is for exemplary purposes only and is not intended to be limiting, and any MFC may be either a high flow MFC or a low flow MFC.

Each MFC 118a-118n may be in fluid communication with the mixing manifold 126 via gas inlet 142a, 142b, 142c, 142n. The gas inlet may be any type of inlet that may be manually or remotely controlled. For example, the gas inlet may be any known junction that may be manually positioned in an open or closed position. The volume of gas from the MFC 118a-118n to the gas inlet 142a-n may be represented by $V_1$. Once the gas enters the mixing manifold 126, it may flow in the direction of flow path B to a mixing manifold exit 140 near the high flow MFC 118a. The high flow carrier gas causes a high forced convection to drive the low flow gas toward the mixing manifold exit 140 thereby attempting to minimizing delay of the mixing with the low flow gas. The volume of gas from the gas inlet 142c to the mixing manifold exit 140 may be represented by $V_2$.

Once the gas mixture exits the mixing manifold 126, the gas mixture may be flowed and retained in an isolation chamber 144 until it is used in a process chamber. The isolation chamber may be any type of chamber used to isolate the gas prior to being used, such as a dual gas feed, or the like.

The total delay time of a low flow gas to mix with a high flow carrier gas (Total Delay Time$_{Low\ Flow\ Gas}$) may be calculated as the time it takes for the low flow gas to reach the mixing manifold ($T_{mm}$) plus the time it takes the gas to diffuse ($T_{diffusion}$) with the high flow carrier gas, as illustrated in the following equation:

$$\text{Total Delay Time}_{Low\ Flow\ Gas} = T_{mm} + T_{diffusion}$$

The time for the low flow gas to reach the mixing manifold 126, or the inertial delay of the low flow gas (illustrated as $V_1$), may be calculated as follows:

$$T_{mm} = (V/\varphi_m)*(P_{mm}/P_{ambient})$$

Where V=volume of the gas; $\varphi_m$ is the mass flow rate of the low flow gas; $P_{mm}$ is the pressure in the mixing manifold; and $P_{ambient}$ is ambient pressure.

The time it takes the low flow gas to diffuse ($T_{diffusion}$) with the high flow carrier gas may be calculated as follows:

$$T_{diffusion} \alpha L^2/D_{effective}$$

That is to say, diffusion delays are proportional to ($L^2$/D), where "L" is the length scale, and D is the diffusion coefficient, which is significant for higher length scales. If a species transported by diffusion only mixes with another species with higher momentum, the transport time of the mixed species increases significantly due to the momentum imparted by convective transport of the second species. It is very difficult to completely eliminate slow transport of species in gas boxes with a tubular/linear arrangement of MFCs due to the prominent use of low flow gases with low velocities, which are primarily transported by diffusion—this necessitates the use of a "pushing gas" for convective transport of species by imparting momentum.

Figure 3:
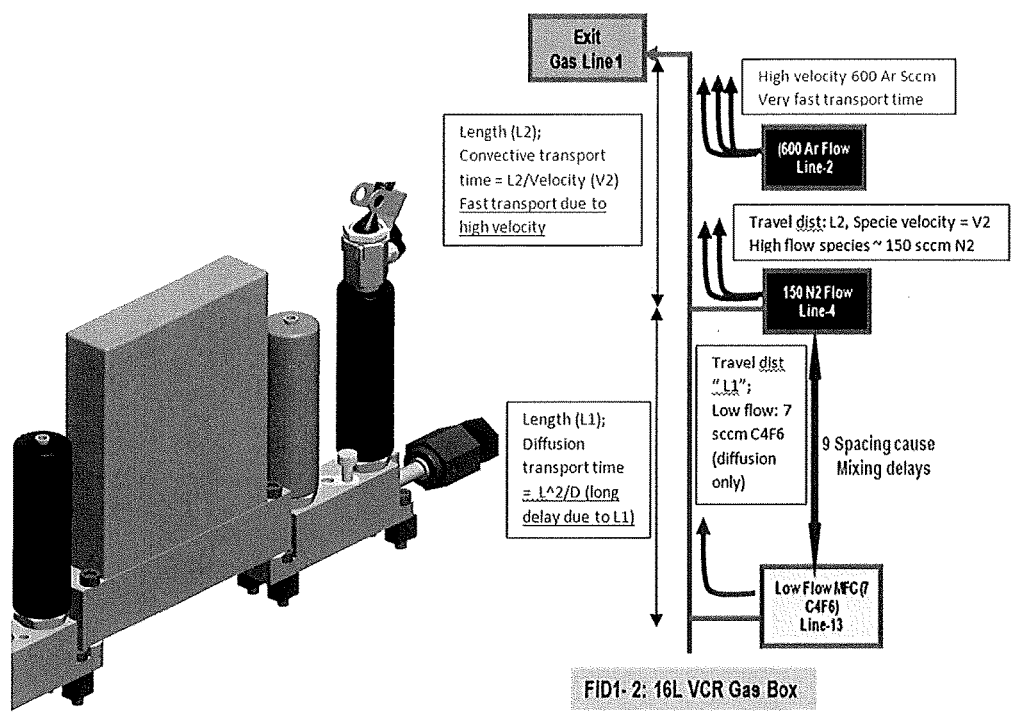

For example, FIG. 3 illustrates a typical gas stick (one per individual gas) having a tubular/linear arrangement of MFCs. The depicted arrangement includes a low-flow MFC (having a $C_4F_6$ flow rate of 7 sccm), a 150 sccm $N_2$ flow, and a 600 sccm Ar flow—these species are used for exemplary purposes only and are not intended to be limiting. Gas introduced from the $C_4F_6$ low flow MFC has a relatively long diffusion transport time/long delay due to its position on the gas line, i.e., due to the length L1 between the low flow MFC and the $N_2$ flow line (Diffusion transport time=$L^2$/D, yielding a long delay due to L1). The travel time for $C_4F_6$ from line 7 to line 4 is equal to (L1/Velocity of $C_4F_6$ species), while the travel time for $N_2$ from line 4 to the exit line is (L2/Velocity of ($C_4F_6+N_2$ species). The travel time of the species depends upon the length scale and velocity of species in this design.

Wafer etching applications are extremely sensitive to the delivery time of the required mixture to the chamber. It is difficult to deliver the necessary mixture of gases to the chamber and then repeat the same on-wafer results with gas boxes having a linear/tubular arrangement of MFCs. In such embodiments, the relative positioning of MFCs on the gas line is crucial—when gas inlets are arranged linearly along a tubular mixing manifold with one or more downstream outlets, the amount of time necessary for the gas to mix and arrive at the reactor chamber changes depending on the relative positions of the gas inlets. If MFC locations are haphazardly mixed (i.e., if the location of a particular MFC is changed between processes), process mismatch results. That is to say, when two gas boxes are configured with their gases in different orders, their gas delivery performance will not match, resulting in reduced device yield.

Accordingly, in embodiments, the present disclosure provides a gas delivery apparatus with consistent (i.e., equal) length scales (path/flow length) for each gas, including the effect of one gas's flow on another, regardless of the relative position of those gases. Thus, as long as two gas boxes include the same gases, they will provide matching gas delivery performance, even if the positions of the gases are changed between processes. Because gas delivery apparatuses according to the instant disclosure provide consistent results regardless of the relative positioning of the gas supplies, such gas delivery apparatuses provide greater flexibility in terms of the variety of applications they can support.

More particularly, in embodiments, the instant disclosure provides a gas delivery apparatus comprising a multi-inlet mixing manifold, where the gas inlets are spaced equally from a center mixing chamber of the manifold. In such an arrangement, the length scales for all gas species approach zero, or are zero. In embodiments, the gas inlets are spaced such that radial lines drawn from the gas inlets to a center point of the center mixing chamber are the same length. In embodiments, the mixing manifold includes a cylindrical mixing chamber, and the gas inlets are may be located at circumferentially spaced locations on a side face and/or axial end face of the cylinder. Arranging all gases on a cylindrical surface in this way collapses a linear tubular design into a single mixing point—that is to say, by arranging all gases on a cylindrical surface such that the length scale approaches zero (or is zero), high and low flow gases can be mixed instantly, and co-flow effects (i.e., gas mixing delays due to gas position or location) can be eliminated.

Figure 4:
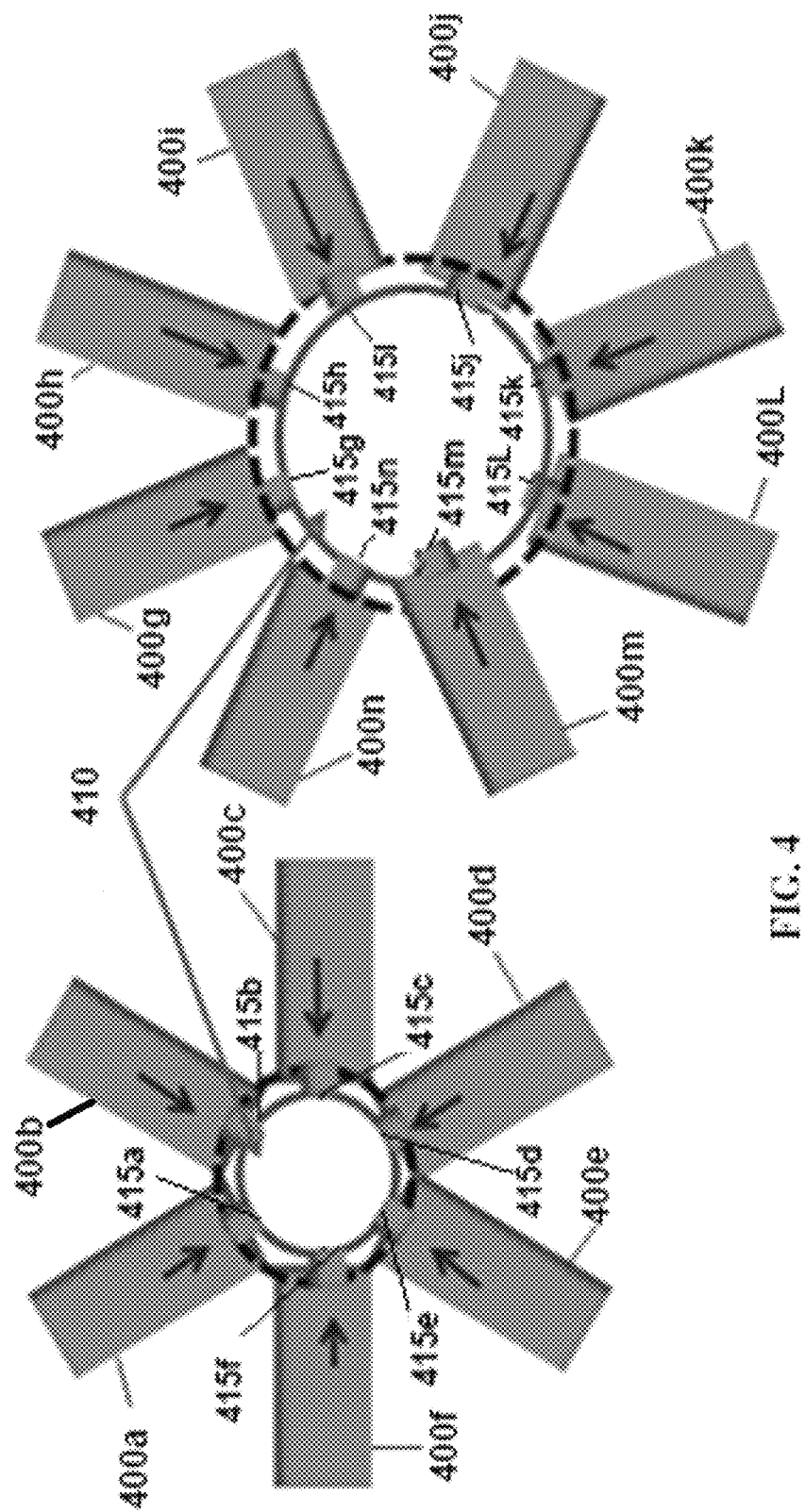

FIG. 4 depicts two exemplary embodiments of gas supplies connected to a mixing manifold. For example, six gas supplies 400a-400f (including, for example, six MFCs) are mounted (circumferentially spaced) on a side face of a cylindrical mixing manifold 410 having a diameter of approximately 1 inch (though diameters of other sizes may be used) via gas inlets 415a-e. A greater or lesser number of gas inlets may be provided, though not all gas inlets need to be connected to a gas supply. As shown in FIG. 4, eight gas supplies 400g-400n are circumferentially spaced on a mixing manifold 410 having a diameter of approximately 1.75 inches. Even if one or more gas inlets are left unconnected to a gas supply, dead legs are not created within the mixing manifold due to the arrangement of the gas supplies and the gas inlets. As shown in FIG. 4, the gas supplies communicate with gas inlets arranged on a cylindrical surface of the mixing manifold. The length scale for each gas species is the same, and all gas species share a common mixing point—accordingly, co-flow effects (i.e., mixing delays between species) are eliminated.

Any appropriate diameter may be selected for the mixing manifold—for example, in embodiments, the diameter of the mixing manifold may be selected to correspond to the diameter needed to equally distribute gas inlets corresponding to a required number of gas supplies. In embodiments, the diameter of the gas manifold may be about 0.5 inches, or about 0.75 inches, or about 1 inch, or about 1.25 inches, or about 1.5 inches, or about 1.75 inches, or about 2 inches, or greater than about 2 inches, such as from about 2 to about 8 inches, or from about 3 to about 5 inches.

In embodiments according to the instant disclosure, the flow path/length for each gas is the same. That is to say, in embodiments, the gas inlets on the mixing manifold are spaced such that a path length from any one of the plurality of gas supplies to the center mixing chamber of the mixing manifold is the same when the gas supply is connected to any of the plurality of gas inlets. Thus, the flow path of a particular gas would be the same regardless of which gas inlet the gas supply is connected to. Because the gas supplies can be connected to any of the gas inlets, the gas delivery apparatus provides a simplified layout, reduces component redundancy, and simplifies the control system. The system also is less heavy and improves process variability and flexibility.

In embodiments, a manual valve may be used for carrying out the supply or isolation of a particular gas supply. The manual valve may also have a lockout/tagout device above it. Worker safety regulations often mandate that plasma processing manufacturing equipment include activation prevention capability, such as a lockout/tagout mechanism. A lockout generally refers, for example, to a device that uses positive means such as a lock, either key or combination type, to hold an energy-isolating device in a safe position. A tagout device generally refers, for example, to any prominent warning device, such as a tag and a means of attachment that can be securely fastened to an energy-isolating device in accordance with an established procedure.

A regulator may be used to regulate the gas pressure of the gas supply and a pressure gas may be used to monitor the pressure of the gas supply. In embodiments, the pressure may be preset and need not be regulated. In other embodiments, a pressure transducer having a display to display the pressure may be used. The pressure transducer may be positioned next to the regulator. A filter may be used to remove impurities in the supply gas. A primary shut-off valve may be used to prevent any corrosive supply gases from remaining in the gas stick. The primary shut-off valve may be, for example, a two-port valve having an automatic pneumatically operated valve assembly that causes the valve to become deactivated (closed), which in turn effectively stops plasma gas flow within the gas stick. Once deactivated, a non-corrosive purge gas, such as nitrogen, may be used to purge the gas stick. The purge gas stick may have, for example, three ports to provide for the purge process (i.e., an entrance port, an exit port, and a discharge port).

A mass flow controller (MFC) may be located adjacent the purge valve. The MFC accurately measures the flow rate of the supply gas. Positioning the purge valve next to the MFC allows a user to purge any corrosive supply gases in the MFC. A mixing valve next to the MFC may be used to control the amount of supply gas to be mixed with other supply cases on the gas panel.

In embodiments, a discrete MFC may independently control each gas supply. Exemplary gas stick and gas panel arrangements, and methods and apparatuses for gas delivery (and controlling time scale of gas delivery), are described, for example, in U.S. Patent Application Publication No. 2010/0326554, U.S. Patent Application Publication No. 2011/0005601, U.S. Patent Application Publication No. 2013/0255781, U.S. Patent Application Publication No. 2013/0255782, U.S. Patent Application Publication No. 2013/0255883, U.S. Pat. No. 7,234,222, U.S. Pat. No. 8,340,827, and U.S. Pat. No. 8,521,461, each of which are commonly assigned, and the entire disclosures of which are hereby incorporated by reference herein in their entireties.

In other embodiments, a single (master) MFC may be used to initiate the desired flow set point for individual fluid ranges and then release the individual fluids for immediate mixing in the mixing manifold. Individual flow measurement and control may be performed from a single MFC printed circuit board (PCB)—in such embodiments, each pressure transducer will prompt the proper positioning of an individual piezoelectric valve. In this way, a single MFC controller can operate multiple fluids. Individual fluid ranges may be set individually, and then released simultaneously for mixing, thus allowing for full MFC capability with common purge. A single system can thus deliver any steps/processes or mixtures, increasing process variability and flexibility.

Figure 5:
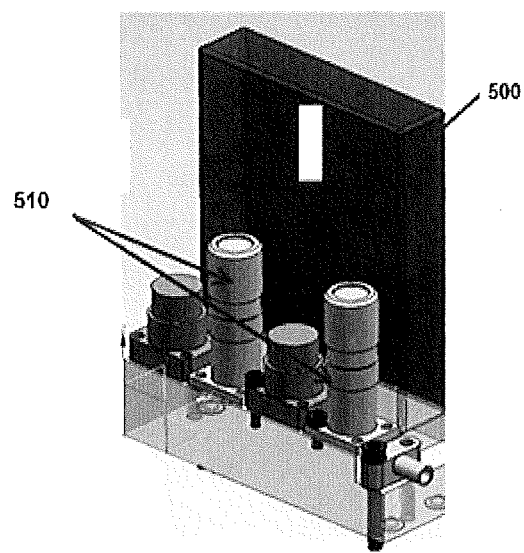

FIG. 5 depicts an array assembly approach using a master MFC 500. As depicted in FIG. 5, additional MFC stations 510 (including a transducer, orifice, and so forth) may be located next to the master MFC. In embodiments, the additional MFC stations can be positioned around the mixing manifold.

In embodiments, MFCs may be controlled by a remote server or controller. Each MFCs may be a wide range MFC having the ability to control either a high flow MFC or a low flow MFC. The controller may be configured to control and change the flow rate of a gas in each of the MFCs.

Figure 6:
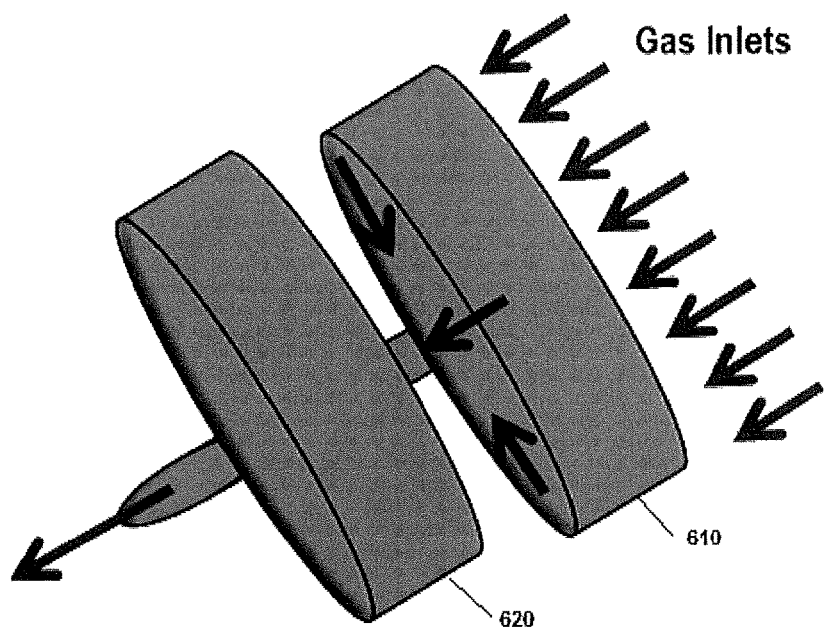

As discussed above, in embodiments, the mixing manifold may include a cylindrical mixing chamber (i.e., in embodiments, the mixing manifold may be a cylinder). In embodiments, particularly embodiments using a large number of MFCs, the gas delivery system may comprise multiple cylindrical surfaces, such as two cylindrical surfaces, or more than two cylindrical surfaces. That is to say, in embodiments, the mixing manifold may be in fluid communication with a second mixing manifold. For example, FIG. 6 illustrates one embodiment having a mixing manifold with two rings. Gas inlets deliver gas to cylinder 610, where the gas is mixed before being delivered to cylinder 620.

In embodiments, the manifold includes a cylindrical mixing chamber, and the MFCs and/or gas supplies are mounted on a side face and/or axial end face thereof. By mounting the MFCs on a side face and/or axial end face of the manifold including a cylindrical mixing chamber, the length scales for each species approach zero (i.e., are zero, or are nearly zero). Gas transport time for each species is thus the same, eliminating the mixing delay problem. In other embodiments, the radial distance from MFC to the mixing manifold may be made of equal length for each gas species to ensure the same gas transport time.

In embodiments, the gas manifold has gas inlets corresponding to each gas supply. In other embodiments, the gas manifold has more gas inlets than gas supplies—because there are additional gas inlets available and because the relative positioning of each gas does not impact gas delivery times, adding another gas to such a gas box can be accomplished without disruption of the existing gases. A gas line may also be removed without disrupting the other gases in the apparatus. This provides greater flexibility in terms of the variety of applications the apparatuses can support. Moreover, in embodiments, even though the manifold may include more gas inlets than gas supplies (i.e., even though there may be some unused gas inlets), the manifold according to the instant disclosure does not include any dead legs (a section of conduit or manifold through which gas does not flow). "Dead legs" are considered to be a source of contamination, as the resulting gas stagnation with long residence times allows chemical reactions and possible metal contamination. Because the gas delivery apparatus according to the instant disclosure does not have any "dead leg" regions in the mixing manifold, the gas delivery apparatus thus avoids these negative results.

Figure 7A:
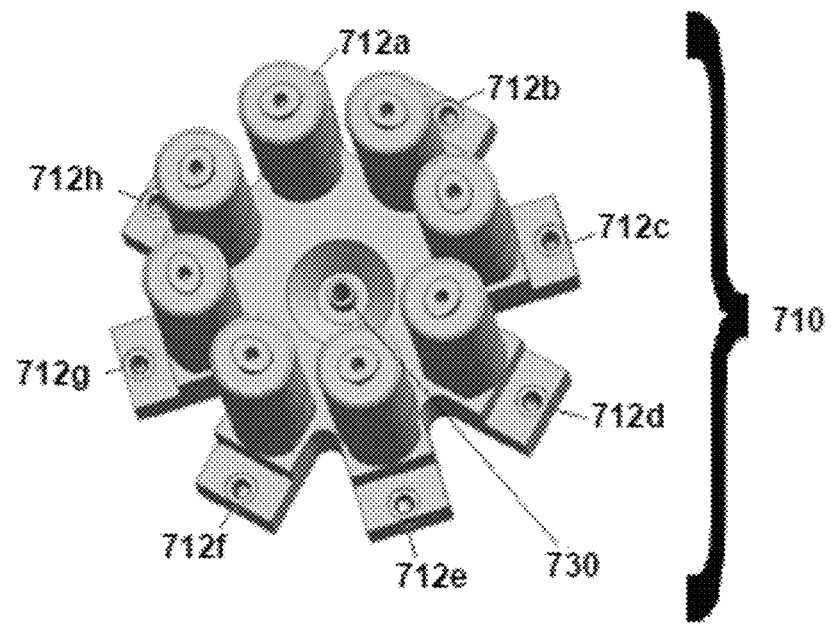
Figure 7B:
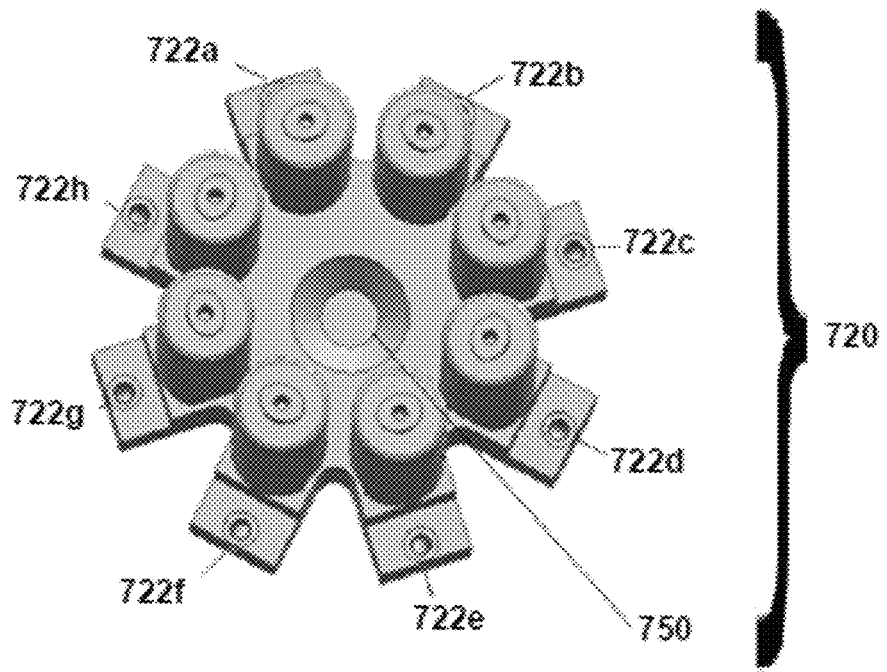
Figure 8A:
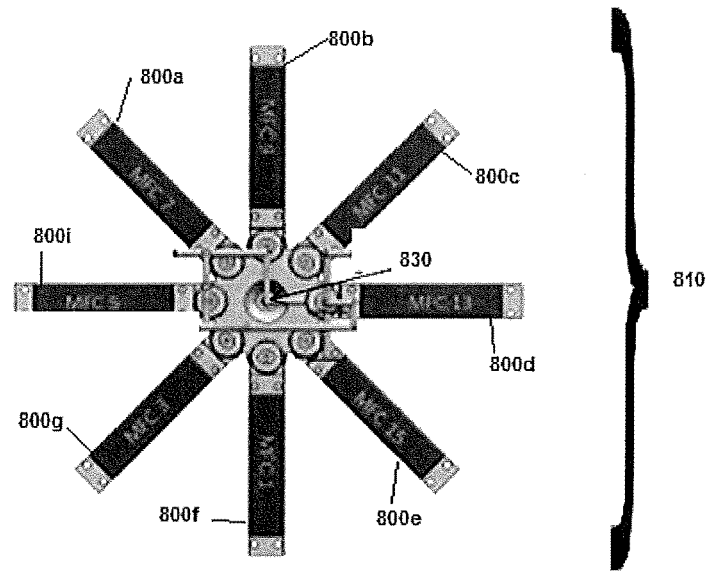
Figure 8B:
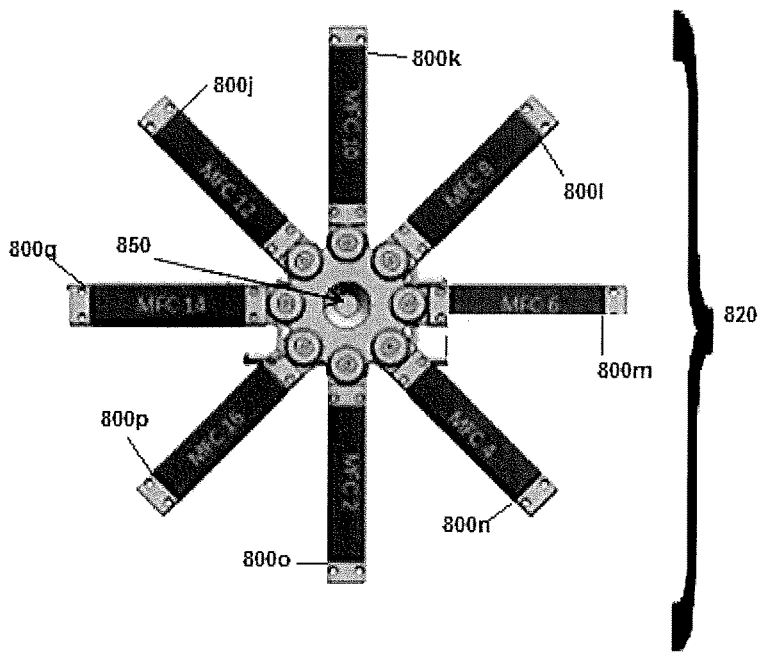
Figure 8C:
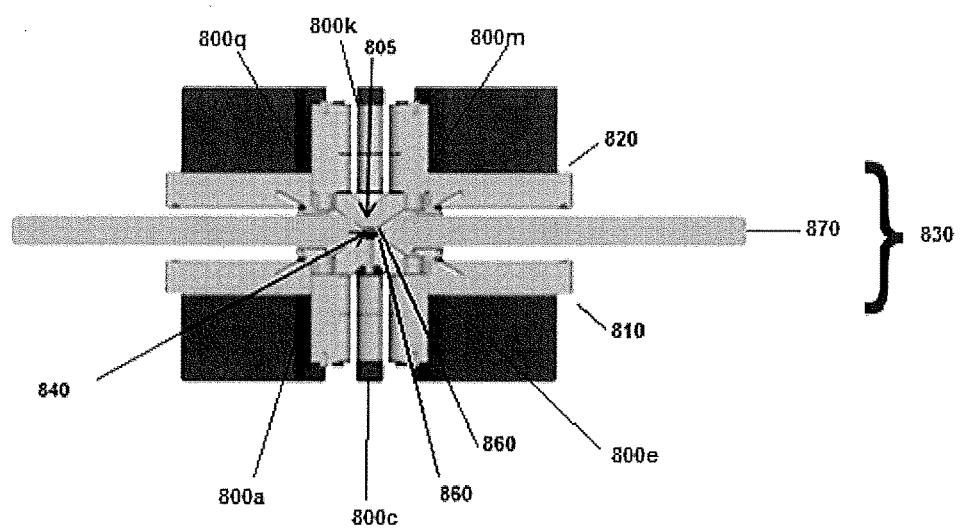

FIGS. 7A and B and FIGS. 8A-C depict embodiments in which gas supplies are connected to a two-piece mixing manifold, where a first (front) mixing hub and a second (rear) mixing hub combine to form a mixing manifold with a center mixing chamber. FIG. 7A depicts an exemplary embodiment of a first mixing hub 710, which in embodiments can form a first (e.g., front) side of the mixing manifold. FIG. 7B depicts an exemplary embodiment of a second (e.g., rear) mixing hub 720, which in embodiments can form a second (rear) side of the mixing manifold. In embodiments, the first mixing hub 710 and the second mixing hub 720 fit together to form a single mixing manifold, with a central mixing chamber in the mixing manifold formed by the connection of the first mixing hub 710 and the second mixing hub 720. Gas supplies may be connected to the first mixing hub 710 via gas connections 712a-h, and gas supplies may be connected to the second mixing hub 720 via connections 722a-h, where the gas connections lead to gas inlets in the mixing manifold. In the embodiments depicted in FIGS. 7A and 7B, the first mixing hub 710 and the second mixing hub 720 can each accommodate/be connected to eight gas supplies via eight connections 712a-h and 722a-h—however, in embodiments, a greater or lesser number of gas connections/gas inlets may be provided. For example in embodiments, at least one side (such as at least two sides) of the mixing manifold (i.e., at least one of the mixing hubs) may include three gas inlets, or four gas inlets, or five gas inlets, or six gas inlets, or seven gas inlets, or nine gas inlets, or ten gas inlets, or twelve or more gas inlets. Gas may be supplied to a center mixing chamber in the mixing manifold formed by the first mixing hub 710 and the second mixing hub 720 via the gas supplies through the gas inlets in the mixing manifold.

In embodiments, the first mixing hub 710 and/or the second mixing hub 720 may include at least one gas outlet 730, which can deliver mixed gases from the mixing chamber of the mixing manifold to a gas delivery line. In other embodiments, a mixing hub 710 or 720 may include a closed surface or blocked outlet 750 which does not have a gas outlet therein.

FIGS. 8A-C depict an exemplary embodiment of gas supplies connected to a mixing manifold 805, where the mixing manifold 805 is formed by connecting a first mixing hub 810 and a second mixing hub 820. FIG. 8A shows a top view of gas supplies 800a-g (including, for example, eight MFCs) mounted in a circumferentially spaced arrangement to the first mixing hub 810. FIG. 8B shows a bottom view of gas supplies 800h-q mounted in a circumferentially spaced arrangement to the second mixing hub 820. The embodiments depicted in FIGS. 8A and 8B show eight gas supplies connected to gas inlets on both the front and rear sides of the hub, but in embodiments, a greater or lesser number of gas inlets may be provided, which may or may not be connected to gas supplies—that is, in some embodiments, all of the gas inlets are connected to gas supplies, while in other embodiments, not all of the gas inlets need to be connected to a gas supply. Even in embodiments where one or more of the gas inlets is not connected to a gas supply, dead legs are not created.

FIG. 8C shows a cross-sectional view of the first mixing hub 810 and the second mixing hub 820 combining to form a mixing manifold 830 with a center mixing chamber 840. For example, the first mixing hub 810 may each contain a central space, such as a central hemispherical space, which corresponds to a central space (such as a central hemispherical space) in the second mixing hub 820 to form a center mixing chamber 805 when the first mixing hub 810 and the second mixing hub 820 are combined, optionally with a base plate 870 surrounding the hubs 810, 820. In embodiments, the center mixing chamber may have other shapes such as spherical, nearly spherical (e.g., multi-faced), ovoid, or cylindrical.

As shown in FIG. 8C, gas supplies (including, for example, MFCs) may be mounted on multiple sides (e.g., a front side and rear side) of the mixing manifold 830 via the first mixing hub 810 and the second mixing hub 820. In embodiments, the first mixing hub 810 and second mixing hub 820 (i.e., the front and rear sides of the mixing manifold 830) are connected to the same number of gas supplies. In other embodiments, the first mixing hub 810 and the second mixing hub 820 are connected to a different number of gas supplies.

In embodiments, the gas supplies are connected to the center mixing chamber via gas inlets 860. In embodiments, the gas inlets 860 may comprise channels in the first mixing hub 810 and/or the second mixing hub 820. As shown in FIG. 8C, the channels of the gas inlets 860 may be diagonal channels in the first mixing hub 810 and/or the second mixing hub 820 leading from the gas supplies 800a-q to the center mixing chamber 840. The gas supplies 800a-q communicate with the gas inlets 860 leading to the mixing chamber. The length scale for each gas species is the same, and all gas species share a common mixing point. Accordingly, co-flow effects (i.e., mixing delays between species) are eliminated.

In embodiments, the center mixing chamber 840 has a diameter of about 0.5 inch, but other sizes may be used—for example, in embodiments, the spherically shaped hub has a diameter of about 0.25 inch, or about 0.3 inch, or about 0.4 inch, or about 0.6 inch, or about 0.8 inch, or about 1 inch, or about 1.5 inches, or about 2 inches. After mixing in the center mixing chamber 840, mixed gases may be connected to a gas delivery line, such as via a gas outlet 830. Gas outlet 830 is shown in a side of the mixing hub 810; however, the gas outlet may be positioned anywhere that does not interfere with the gas inlets 860. For example, a mixing hub may contain a closed surface or blocked outlet 850, and the gas outlet may be positioned on a different portion of the mixing manifold.

The present disclosure further provides, in embodiments, a method of configuring a gas delivery apparatus for supplying process gas to a processing chamber of a plasma processing apparatus. Such a method may include, for example, providing a mixing manifold having a plurality of gas inlets on a surface thereof and at least one mixing manifold outlet. The gas inlets are equally spaced from a center mixing chamber of the mixing manifold, such that the length scale of each gas species is the same and when gas is flowed from gas supplies to the mixing manifold, the gas delivery time for each gas is the same. In embodiments, the method further comprises providing a plurality of gas supplies, and arranging the plurality of gas supplies such that they are in communication with the plurality of gas inlets (i.e., such that gas can flow from the gas supplies to the mixing manifold through the gas inlets).

In embodiments, the present disclosure provides a method of supplying process gas to a processing chamber of a plasma processing apparatus. Such a method may include, for example, providing a plurality of gas supplies in communication with a plurality of gas inlets on a surface of a mixing manifold having at least one mixing manifold outlet; flowing at least two different gases from the plurality of gas supplies to the mixing manifold to create a first mixed gas; and supplying the first mixed gas to a plasma processing chamber coupled downstream of the mixing manifold. The gas inlets are equally spaced from a center mixing chamber of the mixing manifold, such that a path length for each of the at least two different gases is the same, thus allowing for instant mixing of gases (whether high or low flow) and eliminating co-flow effects.

In embodiments, a single mass flow controller initiates a flow set point for each of the at least two different gases and releases them simultaneously for immediate mixing. In other embodiments, a discrete mass flow controller initiates the flow set point for each individual gas, and the discrete mass flow controllers release the gases (simultaneously) for immediate mixing.

In use, gas enters the mixing manifold via a plurality of gas inlets on the mixing manifold. The path length/travel time for each gas is the same—thus, the gases reach a center mixing point of the mixing manifold at the same time and mix. The gas mixture may then exit the mixing manifold via a mixing manifold exit. Mixing manifolds having a plurality of manifold exits are described, for example, in commonly assigned U.S. Patent Application Publication No. 2011/0005601, the entire disclosure of which is hereby incorporated by reference in its entirety.

In embodiments, after exiting the mixing manifold, the first mixed gas may be delivered directly to a processing chamber. In other embodiments, the first mixed gas may be added to another array of gases or mixed gases.

In embodiments, if sufficient gas inlets are available, gas supplies can be added or removed from the apparatus without disrupting the remaining gas supplies. Thus, in use, a method may additionally comprise connecting at least one additional gas supply to a gas inlet on the surface of the mixing manifold, flowing gas from the plurality of gas supplies and the at least one additional gas supply to the mixing manifold to create a second mixed gas, and supplying the second mixed gas to the plasma processing chamber and/or mixing the second mixed gas with another fluid array before supplying to the mixing chamber.

In other embodiments, the supply of gas from at least one of the plurality of gas supplies may be terminated after the first mixed gas is supplied to the processing chamber. In embodiments, the supply of gas may be terminated by detaching the gas supply from the mixing manifold, or shutting of the gas supply. In embodiments, at least three different gases may be flowed from the plurality of gas supplies to the mixing manifold to create the first mixed gas, and the process may further comprise terminating the supply of gas from at least one of the plurality of gas supplies after the first mixed gas is supplied to the processing chamber, flowing gas from the remaining gas supplies of the plurality of gas supplies to the mixing manifold to create a second mixed gas, and supplying the second mixed gas to the processing chamber. Removing the gas supply from the mixing manifold does not create a dead leg within the mixing manifold.

In further embodiments, at least one gas supply may be disconnected, and at least one additional gas supply may be connected to the mixing manifold to create a second mixed gas without disrupting the other gas lines. That is to say, according to the instant disclosure, gas lines may be added, moved, or removed without impacting gas delivery times.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A plasma processing apparatus having a gas delivery apparatus for supplying process gas to a plasma processing chamber of the semiconductor plasma processing apparatus, the gas delivery apparatus comprising:
   a mixing manifold, the mixing manifold including:
      a center mixing chamber;
      a plurality of gas inlets on one or more surfaces of the center mixing chamber, the gas inlets each configured to interface with a corresponding gas supply, wherein the gas inlets are fluidically connected with the center mixing chamber via flow paths of equal length; and
      at least one mixing manifold outlet fluidically connected with the center mixing chamber.

2. The plasma processing apparatus of claim 1, wherein the gas inlets are spaced such that radial lines drawn from the gas inlets to a center point of the center mixing chamber are the same length.

3. The plasma processing apparatus of claim 1, further comprising:
   a plurality of gas supplies, each gas supply component including a pressure transducer and a valve;
   a single mass flow controller configured to control a flow set point for each gas supply of the plurality of gas supplies by adjusting a positioning of the valve for that gas supply based on measurements from the pressure transducer for that gas supply.

4. The plasma processing apparatus of claim 1, wherein:
   the center mixing chamber comprises a cylindrical mixing chamber,
   the gas inlets are at circumferentially spaced locations on the one or more surfaces, and
   the one or more surfaces selected from the group consisting of: a side surface of the mixing manifold, an axial end surface of the mixing manifold, and combinations thereof.

5. The plasma processing apparatus of claim 4, wherein the mixing manifold is in fluidic communication with a second manifold.

6. The plasma processing apparatus of claim 1, further comprising a plurality of gas supplies, wherein:
   the number of gas inlets in the plurality of gas inlets is at least as great or greater than the number of gas supplies in the plurality of gas supplies, and
   each gas supply is interfaced to, and in fluidic communication with, a corresponding one of the gas inlets.

7. The plasma processing apparatus of claim 6, further comprising: a plurality of mass flow controllers, wherein:
   each mass flow controller is in communication with one of the gas supplies and is configured to individually control a flow set-point for that gas supply.

8. The plasma processing apparatus of claim 7, wherein the radial distance from each of the mass flow controllers of the plurality of mass flow controllers to the center mixing chamber is approximately equal length.

9. The plasma processing apparatus of claim 7, wherein the mixing manifold comprises a cylindrical mixing body, and each of the mass flow controllers is mounted to one or more surfaces of the cylindrical mixing body selected from the group consisting of: a side surface of the cylindrical mixing body, an axial end surface of the cylindrical mixing body, and combinations thereof.

10. The plasma processing apparatus of claim 6, wherein the plurality of gas supplies and the plurality of gas inlets are configured such that absence of any of the gas supplies does not result in a dead leg within the mixing manifold.

11. The plasma processing apparatus of claim 1, further comprising the plasma processing chamber, wherein the plasma processing chamber is fluidically connected with the at least one mixing manifold outlet downstream of the mixing manifold.

12. A method of supplying process gas to a processing chamber of a plasma processing apparatus, the method comprising:
   flowing at least two different gases from a plurality of gas supplies to a gas delivery apparatus for supplying process gas to a processing chamber of a semiconductor plasma processing apparatus, the gas delivery apparatus including:

a mixing manifold that includes:
  a center mixing chamber,
  a plurality of gas inlets on one or more surfaces of the center mixing chamber, the gas inlets each interfaced with a corresponding one of the gas supplies, wherein the gas inlets are fluidically connected with the center mixing chamber via flow paths of equal length, and
  at least one mixing manifold outlet fluidically connected with the center mixing chamber, wherein the gases flow into the mixing manifold to create a first mixed gas in the center mixing chamber;
supplying the first mixed gas to an interior of a processing chamber;
energizing the first mixed gas into a plasma state within the processing chamber; and
processing a semiconductor substrate within the processing chamber using the first mixed gas in the plasma state.

13. The method of claim 12, further comprising initiating a flow set point for each of the at least two different gases with a single mass flow controller.

14. The method of claim 13, wherein the single mass flow controller releases the at least two different gases simultaneously for mixing in the mixing manifold.

15. The method of claim 12, further comprising individually initiating a flow set point for each of the at least two different gases with separate mass flow controllers.

16. The method of claim 12, further comprising:
flowing, after the first mixed gas is supplied to the processing chamber, gas from the plurality of gas supplies and gas from at least one additional gas supply to the mixing manifold to create a second mixed gas; and
supplying the second mixed gas to the processing chamber.

17. The method of claim 12, wherein at least three different gases are flowed from the plurality of gas supplies to the mixing manifold to create the first mixed gas, and wherein the process further comprises:
terminating the supply of gas from at least one gas supply of the plurality of gas supplies after the first mixed gas is supplied to the processing chamber,
flowing gas from the remaining gas supplies of the plurality of gas supplies to the mixing manifold to create a second mixed gas in the center mixing chamber;
supplying the second mixed gas to the processing chamber; wherein terminating the supply of gas from the at least one gas supply of the plurality of gas supplies does not create a dead leg within the mixing manifold.

18. The method of claim 12, further comprising mixing the first mixed gas with at least one additional gas before supplying the first mixed gas to the processing chamber.

19. A method of configuring a gas delivery apparatus for supplying process gas to a processing chamber of a plasma processing apparatus, the method comprising:
providing a mixing manifold that includes:
  a center mixing chamber,
  a plurality of gas inlets on one or more surfaces of the center mixing chamber, the gas inlets each interfaced with a corresponding one of the gas supplies, wherein the gas inlets are fluidically connected with the center mixing chamber via flow paths of equal length, and
  at least one mixing manifold outlet fluidically connected with the center mixing chamber, wherein the gases flow into the mixing manifold to create a first mixed gas in the center mixing chamber;
providing a plurality of gas supplies;
arranging the plurality of gas supplies such that each gas supply is in fluidic communication with a corresponding gas inlet of the plurality of gas inlets.

\* \* \* \* \*